(12) United States Patent
Cobo Marzal et al.

(10) Patent No.: US 12,300,420 B2
(45) Date of Patent: May 13, 2025

(54) FILTER DEVICE HAVING TUNABLE CAPACITANCE, METHOD OF MANUFACTURE AND USE THEREOF

(71) Applicant: Astrodyne TDI, Hackettstown, NJ (US)

(72) Inventors: Ruben Cobo Marzal, Port Chester, NY (US); William Koehler, Saylorsburg, PA (US); Gary J. Mulcahy, Flanders, NJ (US)

(73) Assignee: ASTRODYNE TDI, Hackettstown, NJ (US)

( * ) Notice: Subject to any disclaimer, the term of this patent is extended or adjusted under 35 U.S.C. 154(b) by 566 days.

(21) Appl. No.: 17/652,647

(22) Filed: Feb. 25, 2022

(65) Prior Publication Data

US 2022/0270810 A1    Aug. 25, 2022

Related U.S. Application Data

(60) Provisional application No. 63/200,267, filed on Feb. 25, 2021.

(51) Int. Cl.
*H01F 27/28* (2006.01)
*H01G 4/40* (2006.01)
*H03H 1/00* (2006.01)
*H03H 7/01* (2006.01)

(52) U.S. Cl.
CPC .......... *H01F 27/2847* (2013.01); *H01G 4/40* (2013.01); *H03H 1/0007* (2013.01); *H03H 7/0115* (2013.01); *H01F 2027/2857* (2013.01); *H03H 2001/0035* (2013.01); *H03H 2001/005* (2013.01)

(58) Field of Classification Search
CPC ......... H03H 7/0115; H03H 2001/0085; H03H 1/0007; H01F 27/2847; H01F 2027/2857
USPC ........................................ 333/175, 181, 185
See application file for complete search history.

(56) References Cited

U.S. PATENT DOCUMENTS

| | | | |
|---|---|---|---|
| 5,153,812 A * | 10/1992 | Naito ................... | H03H 7/0115 333/185 |
| 6,075,713 A * | 6/2000 | Lee ......................... | H01G 4/255 361/309 |
| 2008/0257488 A1* | 10/2008 | Yamano ................ | H01F 41/122 156/274.2 |
| 2020/0014361 A1* | 1/2020 | Ikemoto .............. | H01F 17/0006 |

* cited by examiner

*Primary Examiner* — Rakesh B Patel
(74) *Attorney, Agent, or Firm* — Boisbrun Hofman, PLLC

(57) ABSTRACT

A filter device, method of manufacture and use thereof. The filter device comprises a foil-wound inductor formed by a first conductive foil strip having a first terminal and a second terminal, the first conductive foil strip wound around a core to form a plurality of winding layers such that the first terminal is proximate the core and the second terminal is located at the outermost winding layer, and a continuous dielectric insulating layer between the plurality of layers of the first conductive foil strip; and, a tunable capacitor formed by a second conductive foil strip at least partially encircling the outermost layer of the foil-wound inductor and a dielectric insulating layer disposed therebetween, the second conductive foil strip having a portion that can be trimmed to alter a capacitance between the second conductive foil strip and the first or second terminal of the foil-wound inductor. When used in a circuit, the tunable capacitor can be trimmed to compensate for parasitic capacitance associated with the foil-wound inductor.

16 Claims, 12 Drawing Sheets f_id(Hz)

US 12,300,420 B2

FILTER DEVICE HAVING TUNABLE CAPACITANCE, METHOD OF MANUFACTURE AND USE THEREOF

RELATED APPLICATIONS

This application claims the benefit of U.S. Provisional Patent Application Ser. No. 63/200,267, filed Feb. 25, 2021, the disclosure of which is incorporated herein by reference.

FIELD OF THE INVENTION

The invention is directed, in general, to filter devices and, more particularly, to an inductor having an integral tunable capacitor.

BACKGROUND

Inductors are electric structures which resist any change in current flow and whose impedance increases with frequency. They are often used as part of filter circuits which prevent propagation of unwanted signals in a circuit. When combined with capacitors and/or resistors in either parallel or series combinations, circuit parameters can be adjusted so as to present extremely high impedance at selected blocking frequencies, thereby limiting signal propagation at these frequencies, while presenting low impedance at other frequencies where signal propagation is desired. Inductors are generally constructed by coiling a conductor around a material with electromagnetic properties, where this material can also include air. FIG. 1 illustrates various types of conventional inductors, including wire coil air-core 110, foil coil air-core 120, wire coil on metal slug 130, and wire coil on metal toroid 140.

Many times, inductors are utilized in circuits to filter high energy signals in the RF frequency range. In such applications, the parasitic capacitance seen from turn-to-turn in an inductor's structure can play an important part in overall filter characteristics. FIG. 2 illustrates a model of an inductor 200 and related parasitic capacitances 210, 220 and 230 between adjacent windings of the inductor. To understand the effect of the parasitic capacitance on filter operation, reference is made to FIG. 3, which illustrates an RF filter circuit 390 including a series inductor 310 with associated parasitic capacitance ($C_f$); FIG. 4, which illustrates a graph of the impedance of the RF filter 390; FIG. 5, which illustrates graphs showing the impact of +/−25% manufacturing tolerances on the achieved value for the parasitic capacitance of the series inductor 310; and, FIG. 6, which illustrates graphs representative of adjusting a shunt capacitor in the RF filter circuit 390 to compensate for variations in the parasitic capacitance of the series inductor 310.

The RF filter 390 illustrated in FIG. 3 includes an inductor 310 (50 μH) in parallel with a capacitor (100 pF), representative of the parasitic capacitance ($C_f$) of the inductor, along with capacitors 320 (100 pF) and 330 (0.22 μF) from first and second terminals of the inductor 390 to circuit ground 350. The impedance 380 presented to the process circuit 370 (and to RF signal generator 360) by the RF filter 390 is illustrated in FIG. 4. As depicted in FIG. 4, the RF filter 390 illustrated in FIG. 3 is designed to present very high impedance at a target frequency of approximately 2 MHz; those skilled in the art will appreciate that other component values can be chosen if a different target frequency is desired.

Realization of the RF filter 390 inductor 310 utilizing an air-core with foil windings, along with a dielectric separator between foil layers, is a well-known technique for achieving the parasitic capacitance $C_f$ shown in FIG. 2. However, tolerance in separator thickness, winding tightness and other material properties of the inductor can result in significant variations in filter performance. For example, FIG. 5 illustrates the impact of +/−25% tolerance on the achieved value for $C_f$. As can be seen in that figure, the impedance 380 at the target frequency can vary dramatically with tolerance in the parallel capacitor (i.e., parasitic capacitance $C_f$); i.e., from about 3.3 kOhms to 180 kOhms due to a change in value of 20%. Many typical systems, however, cannot tolerate such variation; to address that problem, a variable capacitor is sometimes added in parallel with capacitors 320 or 330, or in parallel with inductor 310, in order to tweak the RF filter 390 impedance.

FIG. 6 illustrates the effects of adjusting shunt capacitor 320 to compensate for the parasitic capacitance $C_f$ associated with inductor 310 being low by 20%. With $C_f$=300 pF and capacitor 320=40 pF, the RF filter 390 provides approximately 94 kOhms impedance at 1.9 MHz. If $C_f$ drops to 240 pF, however, the filter center frequency increases to 2 MHz (+5%) and impedance drops to 69 k-Ohm (−27%); impedance at the target frequency 1.9 MHz is down to 1.3 k-Ohm, significantly lower than the original. As capacitor 310 is increased in value, the RF filter's performance begins to return to the target. FIG. 6 also illustrates the effect of capacitor 310 increased to 70 pF and to 100 pF. At 100 pF, the filter performance is similar to the original nominal case. The value of capacitors 330 and 330 can be adjusted in production of the RF filter 390. Adjustable capacitors, however, are often either expensive or difficult to implement. The principles disclosed hereinafter overcome the problems of the prior art in a more cost efficient manner.

SUMMARY

To address the deficiencies of the prior art, disclosed herein are filter devices, methods of manufacture and use thereof. The filter devices comprise a (first) foil-wound inductor formed by a first conductive foil strip having a first terminal and a second terminal, the first conductive foil strip wound around a core to form a plurality of winding layers such that the first terminal is proximate the core and the second terminal is located at the outermost winding layer, and a continuous dielectric insulating layer between the plurality of layers of the first conductive foil strip; and, a tunable capacitor formed by a second conductive foil strip at least partially encircling the outermost layer of the foil-wound inductor and a dielectric insulating layer disposed therebetween, the second conductive foil strip having a portion that can be trimmed to alter a capacitance between the second conductive foil strip and the first and second terminals of the foil-wound inductor. When used in a circuit, the tunable capacitor can be trimmed to compensate for parasitic capacitance associated with the foil-wound inductor.

Preferably, the first conductive foil strip comprises copper; any conductive strip, however, can be utilized. The dielectric insulating layers can be, for example, an insulating adhesive tape, such as the commercially-available Kapton® polyamide tapes. The second conductive foil strip of the tunable capacitor can be trimmed, for example, by a shearing operation; alternatives means of trimming will be described hereinafter.

In some embodiments, the filter device can include a second foil-wound inductor formed on a common core as the first foil-wound inductor, the second foil-wound inductor insulated from the first foil-wound inductor. The first foil-wound inductor can be magnetically coupled to and electrically isolated from the second foil-wound inductor. In a related embodiment, the second conductive foil strip (of the tunable capacitor) at least partially encircling the outermost layer of the first foil-wound inductor also at least partially encircles the outermost layer of the second foil-wound inductor (i.e., is common to both foil-wound inductors), wherein trimming the second conductive foil of the tunable capacitor also alters a capacitance between the second conductive foil strip and first or second terminals of the second foil-wound inductor. Alternatively, the second conductive foil strip can include first and second portions overlaying the first foil-wound inductor and the second foil-wound inductor that can be independently trimmed to alter the capacitance between the second foil strip and first and second terminal ends of each of the first and second foil-wound inductors.

In another embodiment including a second foil-wound inductor, the filter device can further include a second tunable capacitor comprising a third conductive foil strip at least partially encircling the outermost layer of the second foil-wound inductor, wherein trimming the third conductive foil strip of the second tunable capacitor alters a capacitance between the third conductive foil strip and first and second terminals of the second foil-wound inductor.

Methods of manufacturing the filter device, and a method related to use, are also disclosed. In particular, disclosed is a method of tuning a radio frequency (RF) filter having a foil-wound inductor with a tunable capacitor integral therewith, the tunable capacitor including a foil strip at least partially encircling an outermost layer of the foil-wound inductor and a dielectric insulating layer disposed therebetween, wherein a first terminal of the tunable capacitor is common to a terminal of the foil-wound inductor and a second terminal is selectively couplable to ground of the RF filter; the method comprises the steps of: coupling the RF filter to an analyzer without the second terminal of the tunable capacitor coupled to ground; if a frequency of resonance of the RF filter is greater than a desired frequency, coupling the second terminal of the tunable capacitor to ground and determining the frequency of resonance; if the frequency of resonance of the RF filter with the second terminal of the tunable capacitor coupled to ground is then less than the desired frequency, trimming one or more portions of the foil strip of the tunable capacitor until the frequency of resonance of the RF filter increases to the desired frequency.

The foregoing has outlined rather broadly the features and functions of the disclosed filter device. Additional features and advantages of the invention will be described hereinafter, which form the subject matter of the claims. Those skilled in the art will recognize that the conception and specific embodiments disclosed can be utilized as a basis for modifying or designing similar structures, and that such equivalent constructions may fall within the scope of the invention as set forth in the appended claims.

BRIEF DESCRIPTION OF THE DRAWINGS

For a complete understanding of the invention, reference is made to the following detailed description taken in conjunction with the accompanying drawings, in which.

DETAILED DESCRIPTION

Figure 1:
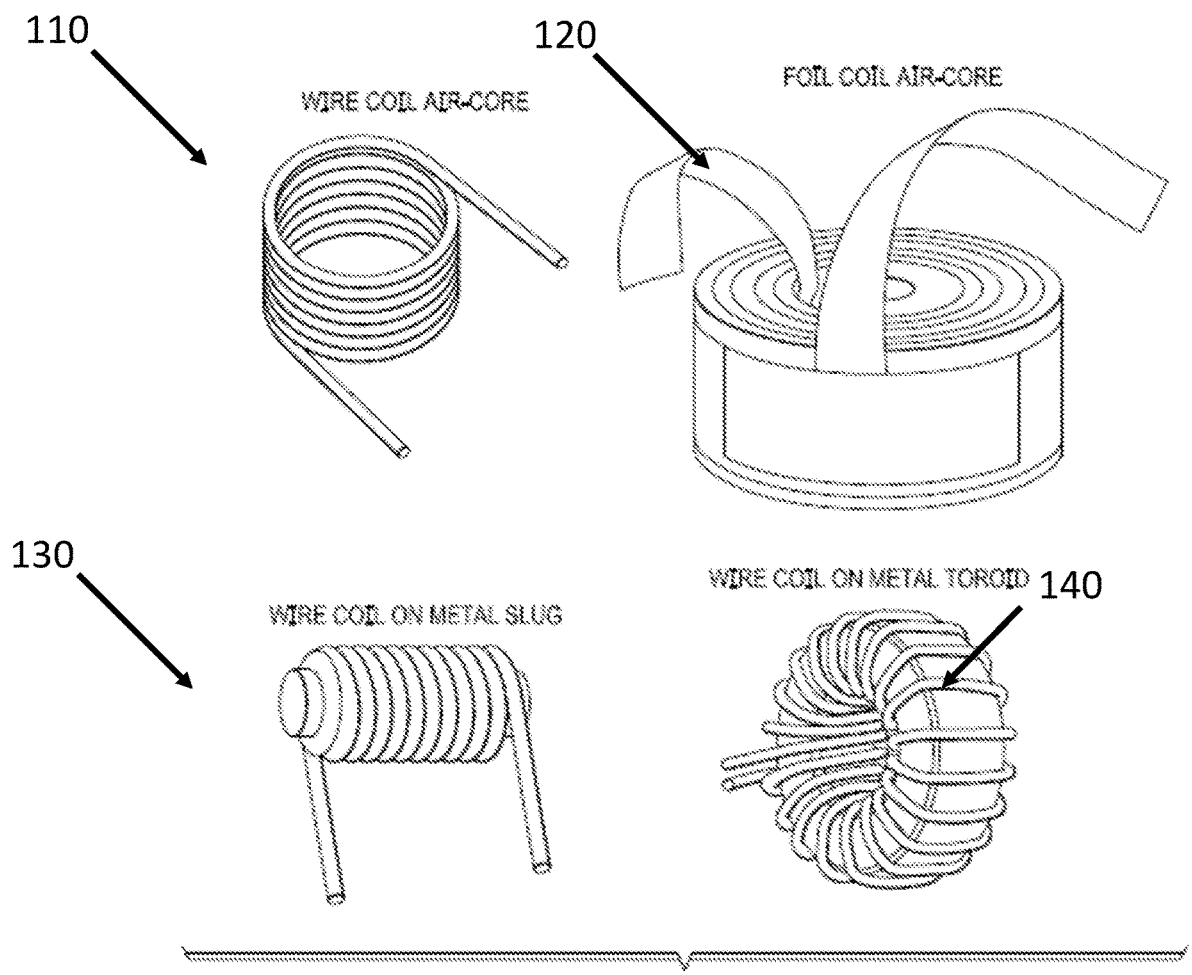
FIG. 1 illustrates various types of conventional inductors.
Figure 2:
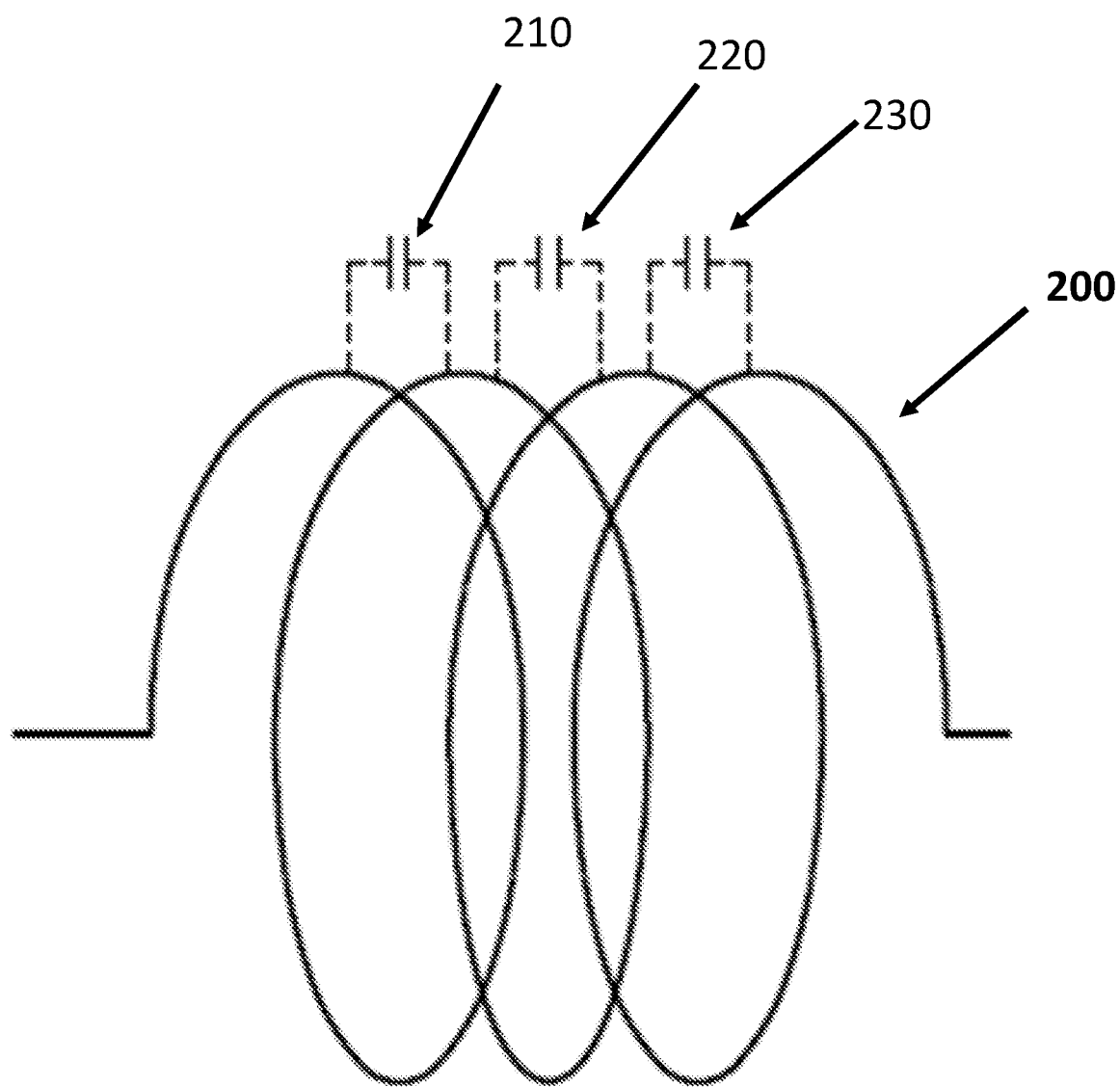
FIG. 2 illustrates a model of an inductor and related parasitic capacitances.
Figure 3:
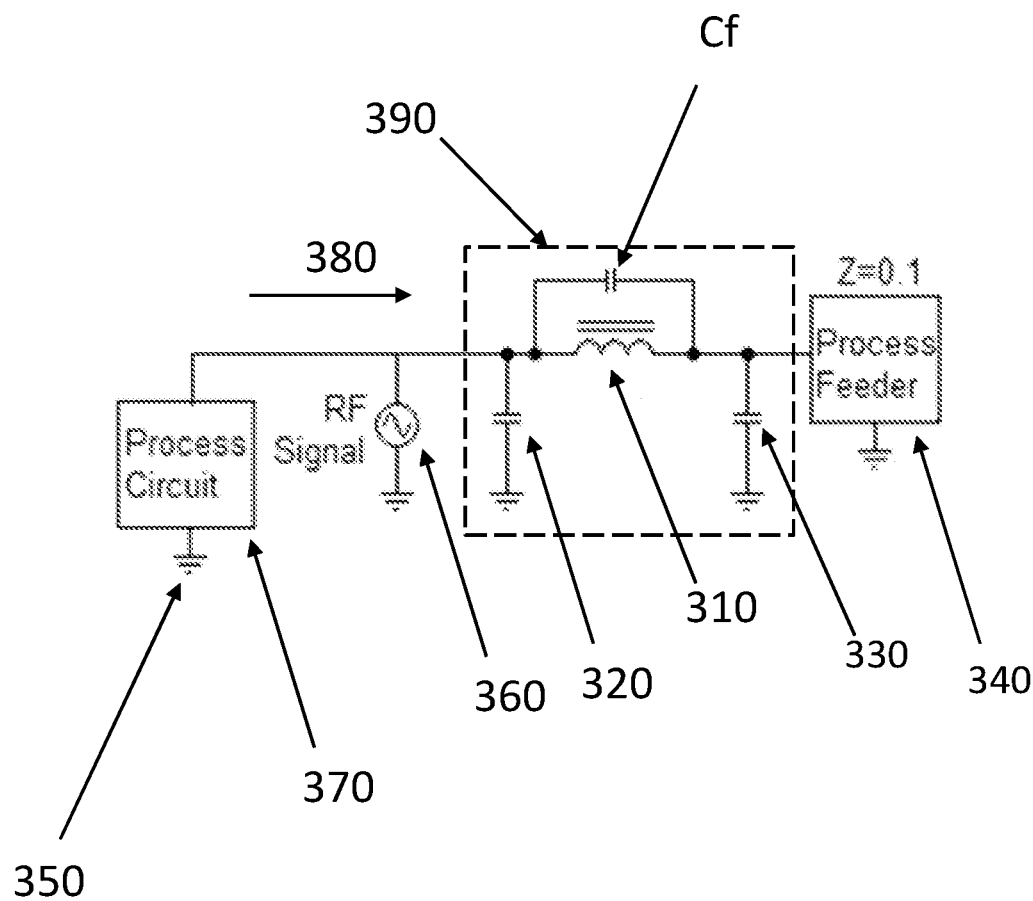
FIG. 3 illustrates an RF filter circuit including a series inductor with associated parasitic capacitance.
Figure 4:
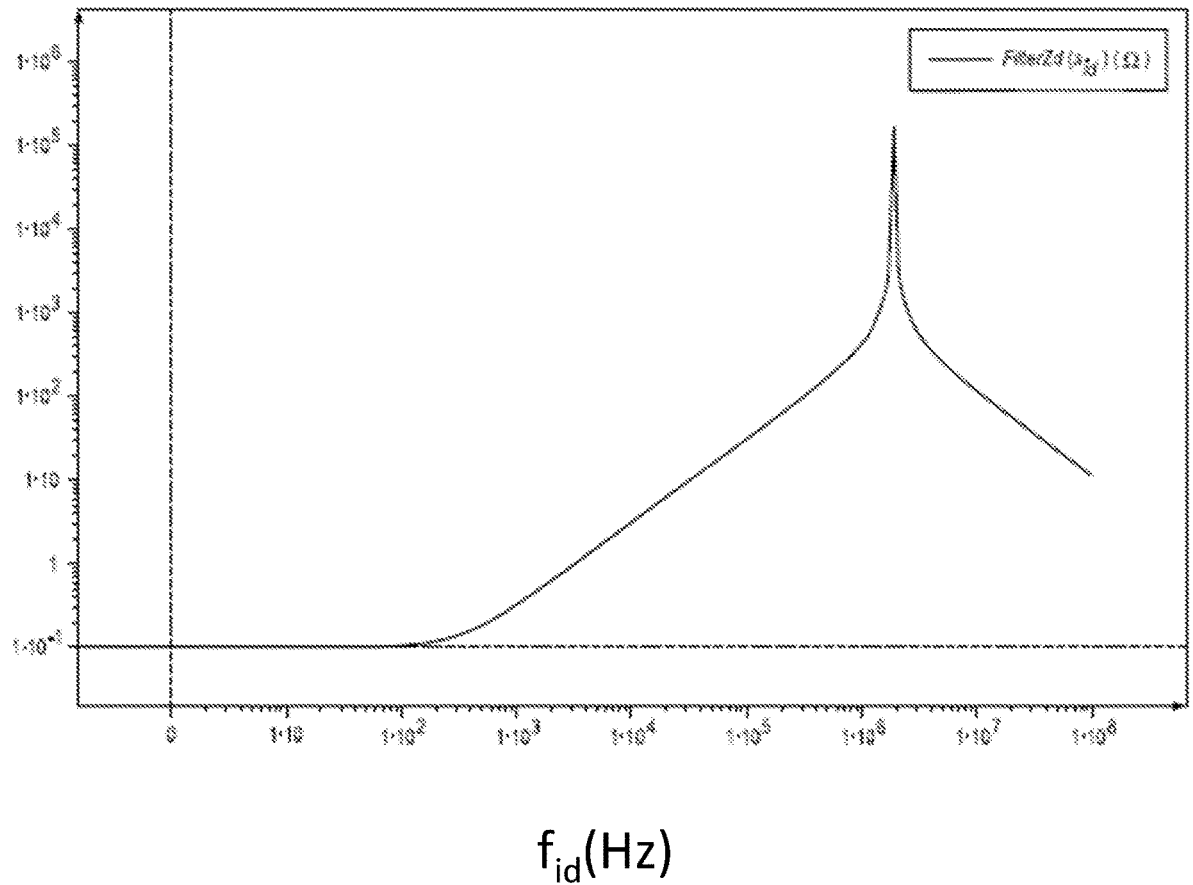
FIG. 4 illustrates a graph of the impedance of the RF filter illustrated in FIG. 3.
Figure 5:
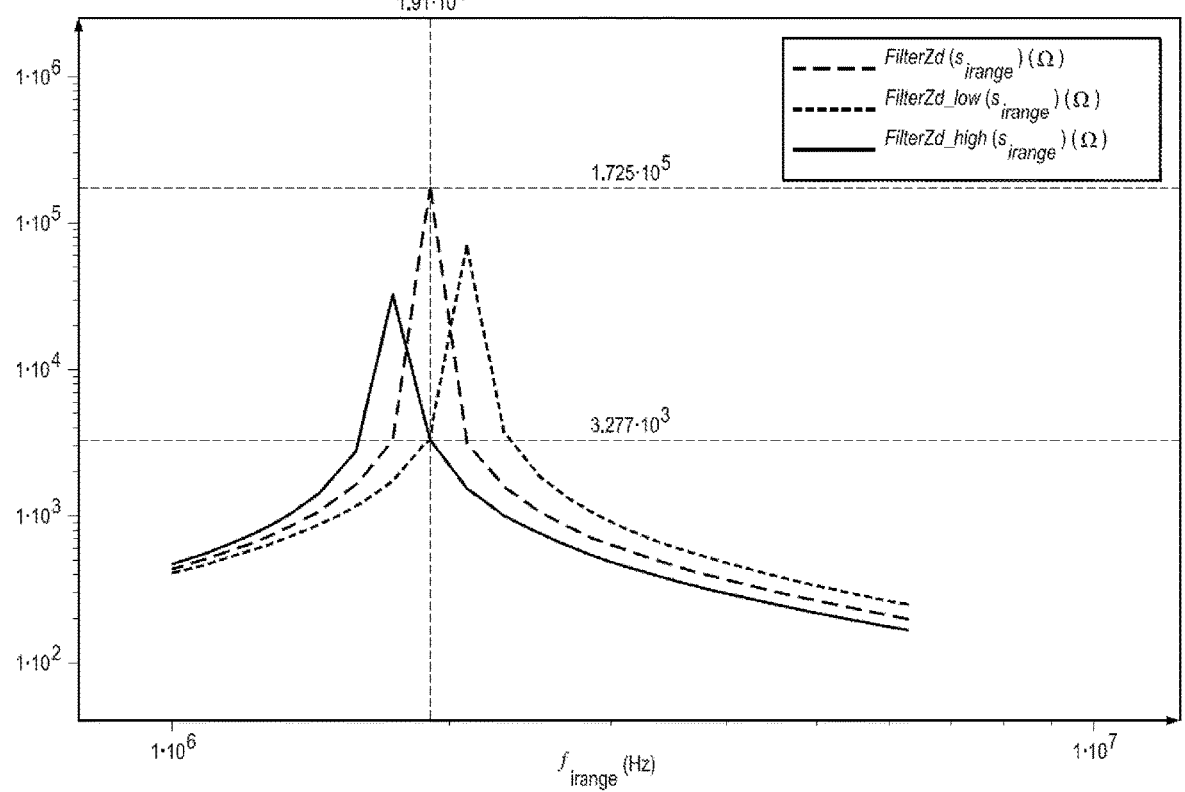
FIG. 5 illustrates graphs showing the impact of +/−25% manufacturing tolerances on the achieved value for the parasitic capacitance of the series inductor in FIG. 3.
Figure 6:
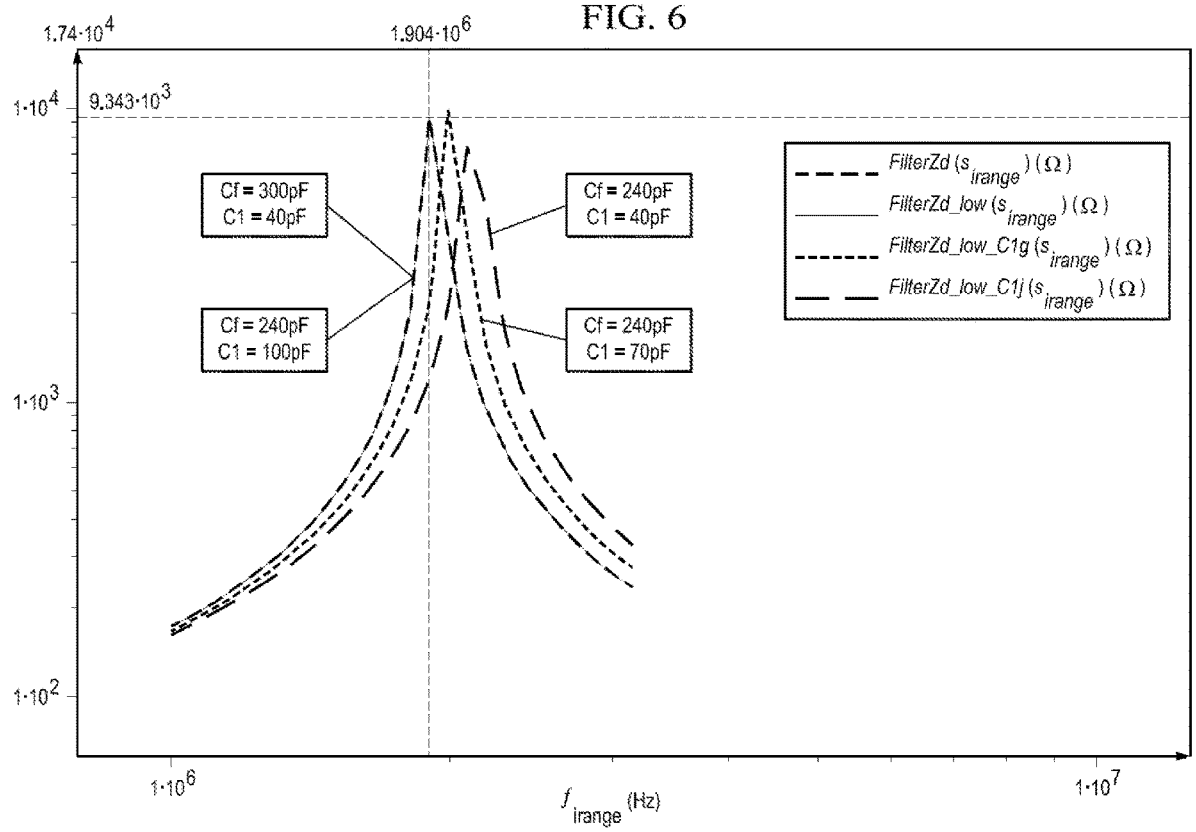
FIG. 6 illustrates graphs representative of adjusting a shunt capacitor in the RF filter circuit illustrated in FIG. 3 to compensate for variations in the parasitic capacitance of the series inductor.
Figure 7:
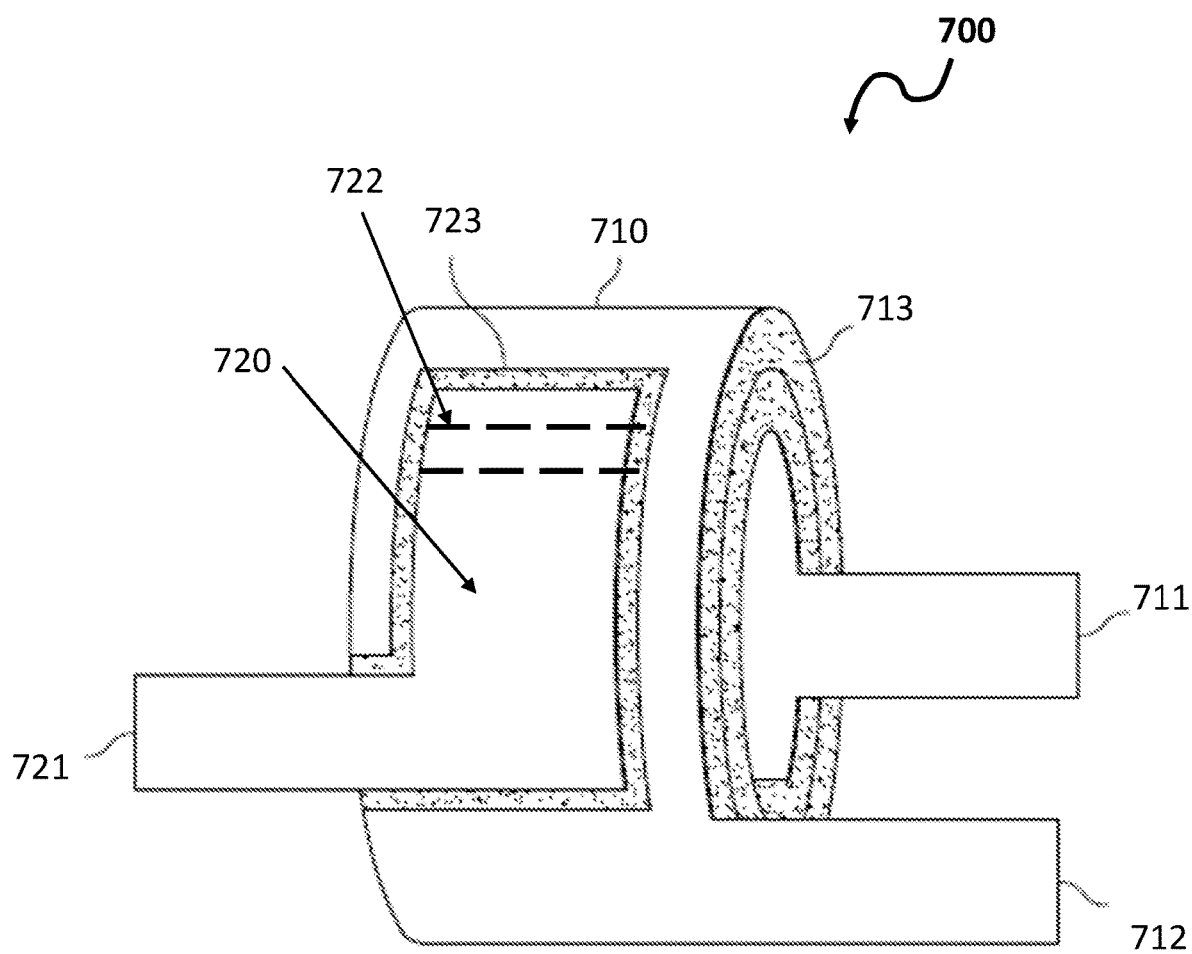
FIG. 7 illustrates a first embodiment of a filter device according to the principles of the invention.
Figure 8:
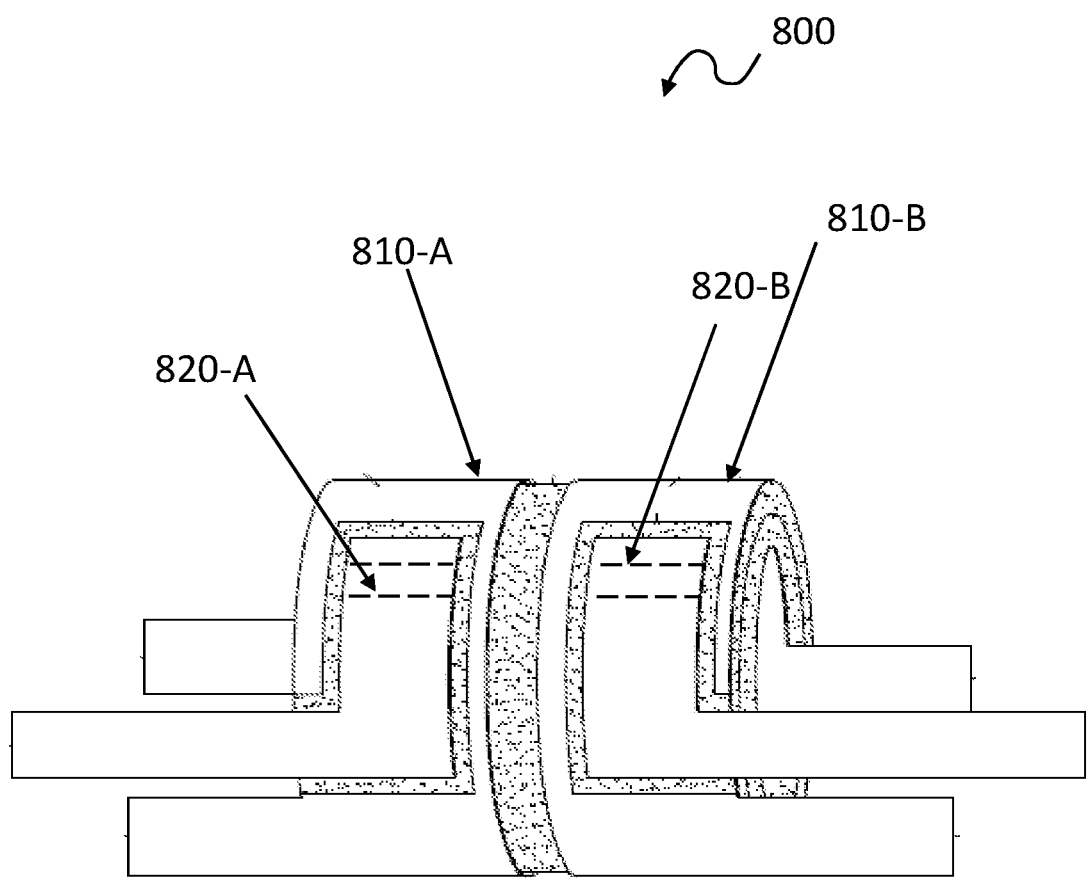
FIG. 8 illustrates a second embodiment of a filter device according to the principles of the invention.
Figure 9:
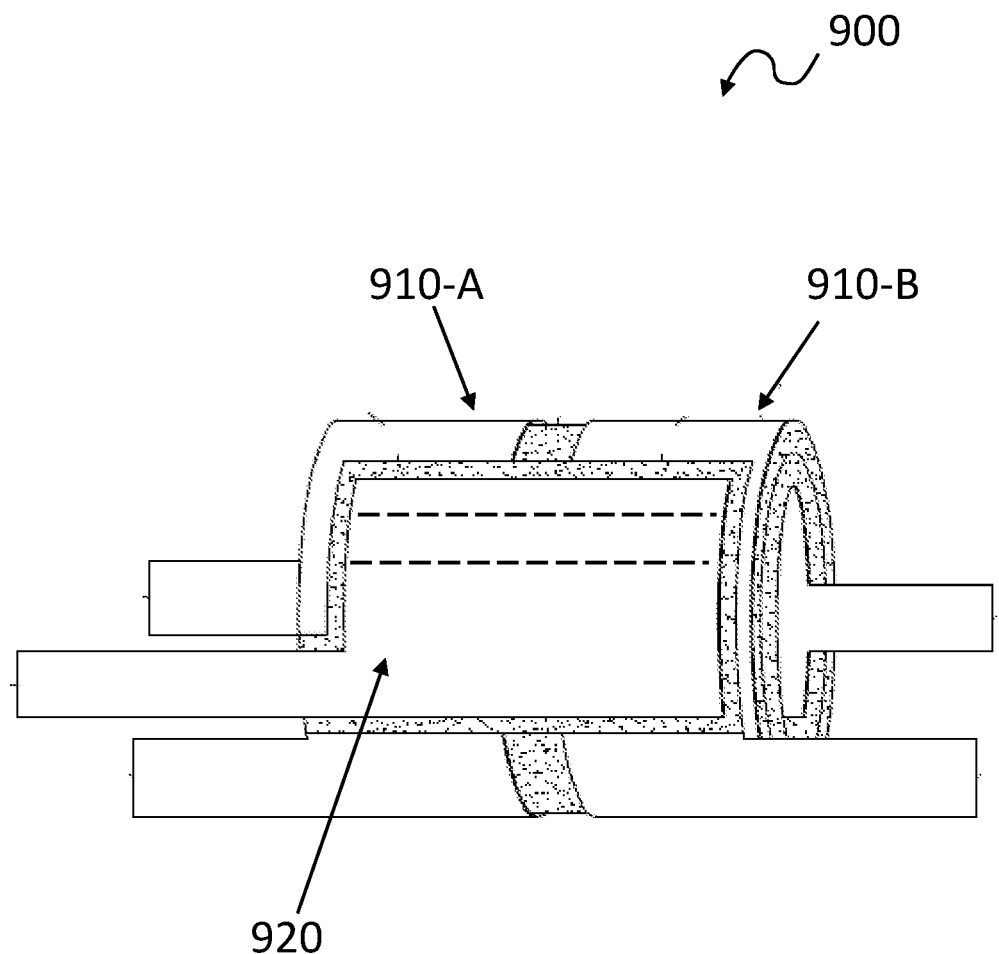
FIG. 9 illustrates a third embodiment of a filter device according to the principles of the invention.

According to the principles disclosed herein, a conventional foil winding inductor is modified to provide a tunable integrated capacitance to ground; several embodiments are illustrated in FIGS. 7, 8 and 9, which share certain features and similar methods of manufacture and use thereof. Referring to FIG. 7 illustrated is a first embodiment of a filter device 700 according to the principles of the invention. The filter device 700 comprises a foil-wound inductor 710 formed by a first conductive foil strip having a first terminal 711 and a second terminal 712; the conductive foil strip can be, for example, copper. The first conductive foil strip 710 is wound around a core to form a plurality of winding layers such that the first terminal 711 is proximate the core and the second terminal 712 is located at the outermost winding layer. The core can be, for example, air. In some embodiments, it may be preferred to use a non-electrically conductive PEEK (polyetheretherketone) core as a coil former, which offers superior magnetic properties, with a dielectric constant over 3× that of air. Increasing the dielectric constant of the core material tends to increase the self-resonant frequency of a coil; see, for example, *The Effect of Dielectric Inside an Inductance Coil*, Alan Payne (2015); https://g3rbj.co.uk/wp-content/uploads/2020/02/The-Effect-of-dielectric-inside-a-coil-iss2.pdf). A continuous dielectric insulating layer 713 is disposed between the plurality of layers of the first conductive foil strip forming inductor 710; the dielectric insulating layer can, for example, be an insulating adhesive tape such as the commercially-available Kapton® polyamide tape.

The filter device 700 further includes a tunable capacitor 720 formed by a second conductive foil strip at least partially encircling the outermost layer of the foil-wound inductor 710 and a dielectric insulating layer 723 disposed therebetween. The second conductive foil strip of the capacitor 720 includes a portion 722 that can be trimmed to alter a capacitance between the second conductive foil strip and the first and second terminals of the foil-wound inductor 710. When used in a circuit, the tunable capacitor can be trimmed to compensate for parasitic capacitance associated with the foil-wound inductor. The trimmable portion 722 can be cut with a manual or automatic cutting or shearing device; alternatively, the trimmable portion 722 can be scored such that one or more portions can be removed to incrementally tune capacitance value of tunable capacitor 720.

In other embodiments, multiple windings can be constructed on a common core to provide the opportunity for part economy and well-matched filtering characteristics. Each winding can feature its own individual capacitive tuning strip, to optimize its blocking impedance at the desired value, or a common tuning strip can be provided. For example, with reference to FIG. 8, illustrated is a second embodiment of a filter device 800 featuring multiple inductors formed on a common core, with independent tunable capacitors. The filter device 800 comprises first and second foil-wound inductors 810-A and 810-B similar in structure to foil-wound inductor 710; the foil-wound inductors, however, are formed on a common core, and may share a common insulating layer. The filter device 800 further includes independent tunable capacitors 820-A and 820-B formed integrally to inductors 810-A and 810-B, respectively; each of the tunable capacitors includes trimmable portions such as trimmable portion 722 of filter device 700. Next, FIG. 9 illustrates is a third embodiment of a filter device 900 featuring multiple inductors formed on a common core, with a single tunable capacitor. As with filter device 800, filter device 900 comprises first and second foil-wound inductors 910-A and 910-B, similar in structure to foil-wound inductor 710; the foil-wound inductors, however, are formed on a common core, and may share a common insulating layer. Unlike filter device 800, however, filter device 900 has a single tunable capacitor 920 formed over, and at least partially encircling the outermost layer of both foil-wound inductors 910-A and 910-B.

Tests were conducted to demonstrate the adjustability of a tunable filter device according to the principles disclosed herein. In one test, a sample was constructed with 25.4 mm (1") wide copper (Cu) strip. The Cu strip was calibrated into 1 mm wide increments, and the resonant frequency was measured as 1 mm increments of strip were progressively removed; the following table presents the measurement results of the resonant frequency as portions of the Cu tape were progressively removed.

| Cu Tape Removed (1 mm increments) | Resonant Frequency |
|---|---|
| 0 | 19.771 |
| 1 | 20.082 |
| 2 | 20.206 |
| 3 | 20.33 |
| 4 | 20.64 |
| 5 | 20.82 |
| 6 | 21.08 |
| 7 | 21.327 |

Figure 10:
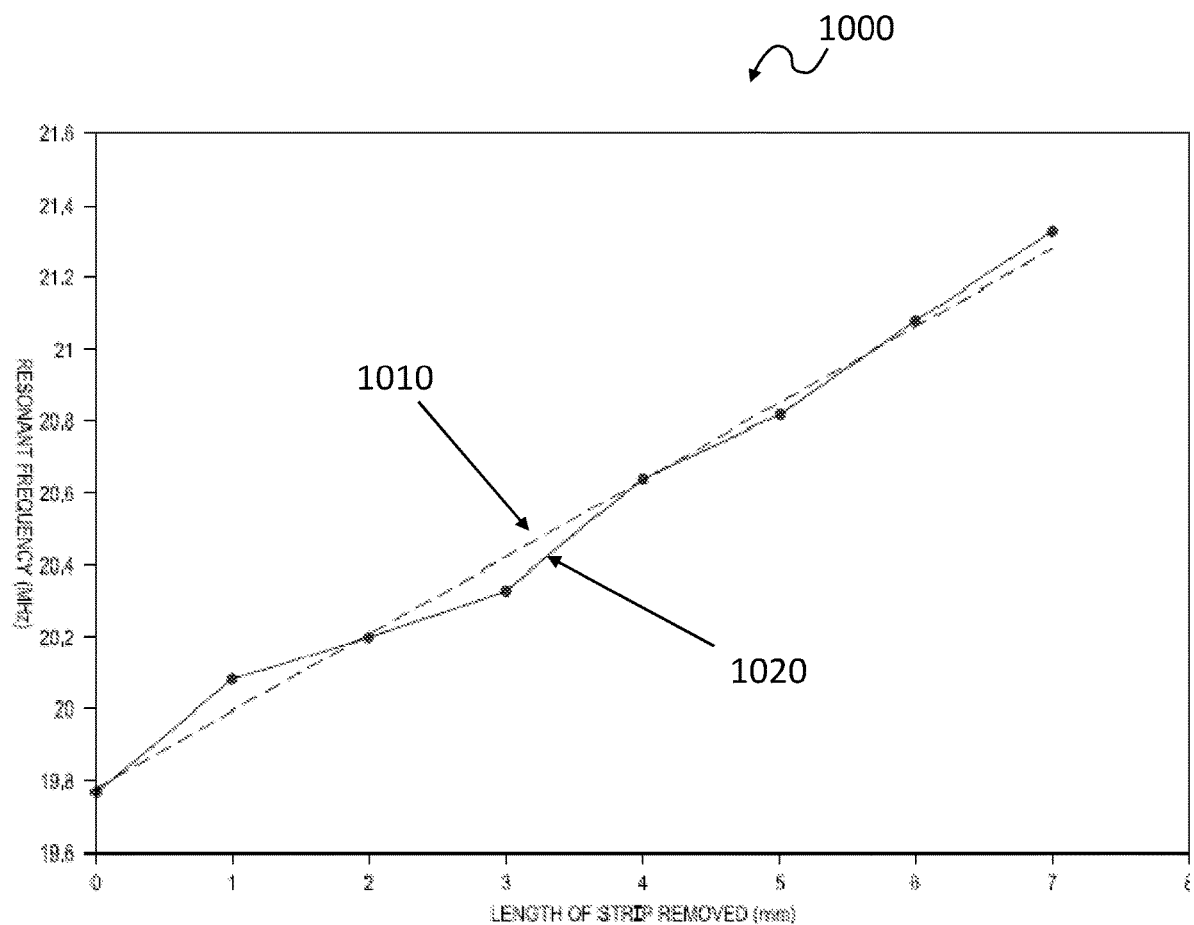
FIG. 10 illustrates a graphical representation of an exemplary RF filter resonant frequency as portions of a tunable capacitor of a filter device, designed in accordance with the principles of the invention, are removed.

FIG. 10 provides a graphical representation 1000 of the test results. The achieved resonant frequency (plot 1020) illustrated in FIG. 10 is fairly linear versus the amount of the Cu tape that is removed, and can be approximated by the equation: $F_r \sim = 19.77$ MHz+0.222 MHz/mm (as illustrated by the plot 1010).

As a practical example, if the desired resonant frequency is 20.6 MHz+/−1%=20.39-20.81 MHz, then a trim length of 4 mm+/−1 mm (0.157"+/−0.04"), which is easily achievable with conventional production tools, can provide the required precision. If greater precision is required, the width of the copper strap can be reduced, producing a smaller change in copper tape area per length of tab removed, which in turn will produce a smaller change in resonant frequency per length of tape removed. Other alternatives for removing portions of the copper strip are also possible, including progressively removing portions from the end or the side that are of equal or unequal dimensions to progressively tune the resonant frequency in a linear or non-linear manner.

Figure 11:
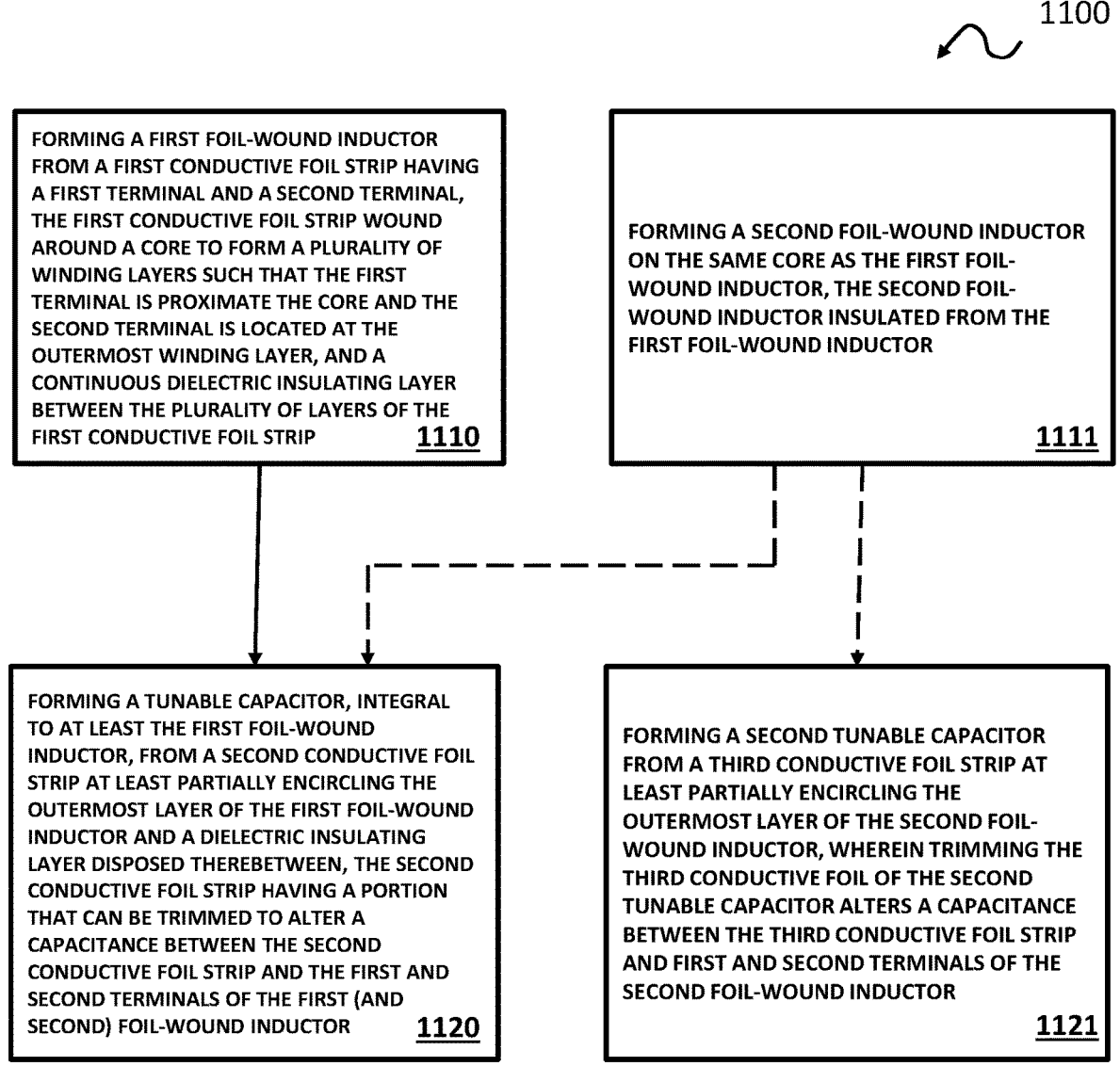
FIG. 11 illustrates a method of constructing a filter device according to the principles of the invention; and, FIG. 12 illustrates a method of tuning a radio frequency (RF) filter having a filter device according to the principles of the invention.

The filter devices 700, 800 and 900 illustrated in FIGS. 7, 8 and 9, respectively, can be constructed using the method illustrated in FIG. 11. For the embodiment illustrated in FIG. 7, the method comprises, in a first step 1110, forming a first foil-wound inductor (710) from a first conductive foil strip having a first terminal and a second terminal, the first conductive foil strip wound around a core to form a plurality of winding layers such that the first terminal is proximate the core and the second terminal is located at the outermost winding layer, having a continuous dielectric insulating layer between the plurality of layers of the first conductive foil strip. Next, in a step 1120, forming a tunable capacitor (720), integral to the foil-wound inductor, from a second conductive foil strip at least partially encircling the outermost layer of the foil-wound inductor and a dielectric insulating layer disposed therebetween, the second conductive foil strip having a portion that can be trimmed to alter a capacitance between the second conductive foil strip and the first and second terminals of the foil-wound inductor.

For the embodiments illustrated in FIGS. 8 and 9, the method can further include, in a step 1111, forming a second foil-wound inductor (810-B, 910-B) on the same core as the first foil-wound inductor (810-A, 910-A), the second foil-wound inductor insulated from the first foil-wound inductor. For the filter device 800, the method then comprises step 1121, forming a second tunable capacitor (820-B), integral to the foil-wound inductor, from a third conductive foil strip at least partially encircling the outermost layer of the second foil-wound inductor (810-B). Alternatively, for the filter device 900, the method then comprises step 1120 (as with filter device 700), but the tunable capacitor (920), is integral with both the first and second foil-wound inductors (910-A, 910-B).

Figure 12:
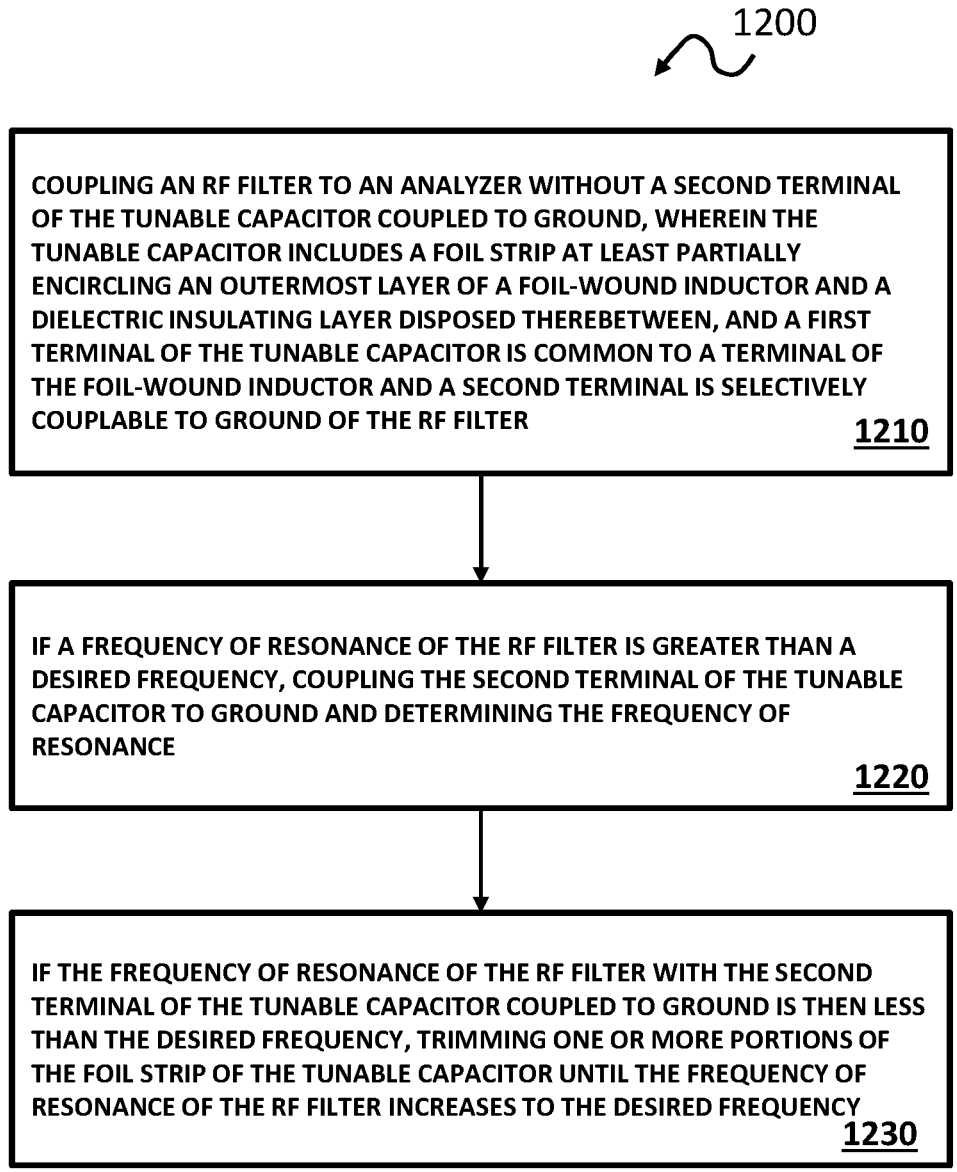

Finally, FIG. 12 illustrates a method 1200 of tuning a radio frequency (RF) filter having a filter device according to the principles of the invention. In a first step 1210, the RF filter is connected to an analyzer without the second terminal of the tunable capacitor coupled to ground. In a second step 1220, if the frequency of resonance of the RF filter measured in step 1210 is greater than a desired frequency, the second terminal of the tunable capacitor is coupled to ground, and the frequency of resonance is again determined. Finally, in step 1230, if the frequency of resonance of the RF filter with the second terminal of the tunable capacitor coupled to ground is then less than the desired frequency, one or more portions of the foil strip of the tunable capacitor are trimmed until the frequency of resonance of the RF filter increases to the desired frequency.

The technical principles disclosed herein provide a foundation for designing inductive filter devices having an integral tunable capacitor to compensate for parasitic capacitances. The examples presented illustrate the application of the technical principles and are not intended to be exhaustive or to be limited to the specifically-disclosed examples or methods; it is only intended that the scope of the technical principles be defined by the claims appended hereto, and their equivalents.

We claim:

1. A filter device, comprising:
   a foil-wound inductor formed by a first conductive foil strip having a first terminal and a second terminal, said first conductive foil strip wound around a core to form a plurality of winding layers such that said first terminal is proximate said core and said second terminal is located at an outermost winding layer, and a continuous dielectric insulating layer between said plurality of winding layers of said first conductive foil strip;

a tunable capacitor, integral to said foil-wound inductor, formed by a second conductive foil strip at least partially encircling said outermost winding layer of said foil-wound inductor and a dielectric insulating layer disposed therebetween, said second conductive foil strip having a portion that can be trimmed to alter a capacitance between said second conductive foil strip and said first and second terminals of said foil-wound inductor, and a second foil-wound inductor formed on said core with said foil-wound inductor, said second foil-wound inductor being insulated from said foil-wound inductor, wherein said second conductive foil strip at least partially encircles said outermost winding layer of said foil-wound inductor and also at least partially encircles an outermost winding layer of said second foil-wound inductor, wherein trimming said second conductive foil strip of said tunable capacitor also alters a capacitance between said second conductive foil strip and first and second terminals of said second foil-wound inductor.

2. The filter device recited in claim 1, wherein said capacitance can be adjusted to compensate for a parasitic capacitance associated with said foil-wound inductor.

3. The filter device recited in claim 1, wherein said first conductive foil strip comprises copper.

4. The filter device recited in claim 1, wherein said dielectric insulating layers comprise an insulating adhesive tape.

5. The filter device recited in claim 1, wherein said second conductive foil strip of said tunable capacitor can be trimmed by a shearing operation.

6. The filter device recited in claim 1, wherein said second conductive foil strip comprises first and second portions overlaying said foil-wound inductor and said second foil-wound inductor that can be independently trimmed to alter said capacitance between said second conductive foil strip and first and second terminals of each of said foil-wound inductor and said second foil-wound inductor.

7. The filter device recited in claim 1, wherein said foil-wound inductor is magnetically coupled to and electrically isolated from said second foil-wound inductor.

8. A method of manufacturing a filter device, comprising:
forming a foil-wound inductor from a first conductive foil strip having a first terminal and a second terminal, said first conductive foil strip wound around a core to form a plurality of winding layers such that said first terminal is proximate said core and said second terminal is located at an outermost winding layer, and a continuous dielectric insulating layer between said plurality of winding layers of said first conductive foil strip;

forming a tunable capacitor, integral to said foil-wound inductor, from a second conductive foil strip at least partially encircling said outermost winding layer of said foil-wound inductor and a dielectric insulating layer disposed therebetween, said second conductive foil strip having a portion that can be trimmed to alter a capacitance between said second conductive foil strip and said first and second terminals of said foil-wound inductor, and forming a second foil-wound inductor on said core with said foil-wound inductor, said second foil-wound inductor being insulated from said foil-wound inductor, wherein said second conductive foil strip at least partially encircles said outermost winding layer of said foil-wound inductor and also at least partially encircles an outermost winding layer of said second foil-wound inductor, wherein trimming said second conductive foil strip of said tunable capacitor also alters a capacitance between said second conductive foil strip and first and second terminals of said second foil-wound inductor.

9. The method recited in claim 8, wherein said capacitance can be adjusted to compensate for a parasitic capacitance associated with said foil-wound inductor.

10. The method recited in claim 8, wherein said second conductive foil strip of said tunable capacitor can be trimmed by a shearing operation.

11. The method recited in claim 8, wherein said second conductive foil strip comprises first and second portions overlaying said foil-wound inductor and said second foil-wound inductor that can be independently trimmed to alter said capacitance between said second conductive foil strip and first and second terminals of each of said foil-wound inductor and said second foil-wound inductor.

12. The method recited in claim 8, wherein said foil-wound inductor is magnetically coupled to and electrically isolated from said second foil-wound inductor.

13. The method recited in claim 8, wherein said first conductive foil strip comprises copper.

14. The method recited in claim 8, wherein said dielectric insulating layers comprise an insulating adhesive tape.

15. A method of tuning a radio frequency (RF) filter having a foil-wound inductor with a tunable capacitor integral therewith, said tunable capacitor including a conductive foil strip at least partially encircling an outermost winding layer of said foil-wound inductor and a dielectric insulating layer disposed therebetween, wherein a first terminal of said tunable capacitor is common to a terminal of said foil-wound inductor and a second terminal is selectively couplable to ground of said RF filter, said method comprising the steps of:
coupling said RF filter to an analyzer without said second terminal of said tunable capacitor coupled to said ground;
if a frequency of resonance of said RF filter is greater than a desired frequency, coupling said second terminal of said tunable capacitor to said ground and determining said frequency of resonance;
if said frequency of resonance of said RF filter with said second terminal of said tunable capacitor coupled to said ground is less than said desired frequency, trimming one or more portions of said conductive foil strip of said tunable capacitor until said frequency of resonance of said RF filter increases to said desired frequency.

16. The method recited in claim 15, wherein said conductive foil strip of said tunable capacitor is trimmed by a shearing operation.

* * * * *